United States Patent
Ward

(10) Patent No.: US 8,589,855 B1
(45) Date of Patent: Nov. 19, 2013

(54) MACHINE-LEARNING BASED DATAPATH EXTRACTION

(75) Inventor: Samuel I. Ward, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/484,111

(22) Filed: May 30, 2012

(51) Int. Cl.
G06F 17/50 (2006.01)
(52) U.S. Cl.
USPC .......................................... 716/136; 716/126
(58) Field of Classification Search
USPC .................................................. 716/126, 136
See application file for complete search history.

(56) References Cited

U.S. PATENT DOCUMENTS

| | | | |
|---|---|---|---|
| 6,598,215 B2 | 7/2003 | Das et al. | |
| 7,376,922 B2 | 5/2008 | Rushing et al. | |
| 8,130,582 B2 * | 3/2012 | Shimano et al. | 365/210.1 |
| 2012/0054699 A1 | 3/2012 | Cho et al. | |

OTHER PUBLICATIONS

Chowdhary, A. et al., "Extraction of Functional Regularity in Datapath Circuits", IEEE Trans. on Computer-Aided Design of Integrated Circuits and Systems, vol. 18, No. 9, pp. 1279-1296 (Sep. 1999).

Ienne, P. et al., "Practical Experiences with Standard-Cell Based Datapath Design Tools", Proc. Design Automation Conference, pp. 396-401 (Jun. 1998).
Liu, Q. et al., "Pre-layout Physical Connectivity Prediction with Application in Clustering-Based Placement", Proc. of the IEEE Int'l. Conf. on Computer Design, pp. 31-37 (Oct. 2005).
Nijssen, R. et al., "Two-Dimensional Datapath Regularity Extraction", IFIP Workshop on Logic and Architecture Synthesis, pp. 110-117 (1996).
Ono, S. et al., "On Structure and Suboptimality in Placement", Proc. of Asia and South Pacific Design Automation Conference, pp. 331-336 (2005).
Rosiello, A. et al., "A Hash-based Approach for Functional Regularity Extraction During Logic Synthesis", Proc. of the IEEE Annual Symposium on VLSI, pp. 92-97 (2007).

* cited by examiner

*Primary Examiner* — Thuan Do
(74) *Attorney, Agent, or Firm* — Matthew W. Baca; Jack V. Musgrove

(57) ABSTRACT

A datapath extraction tool uses machine-learning models to selectively classify clusters of cells in an integrated circuit design as either datapath logic or non-datapath logic based on cluster features. A support vector machine and a neural network can be used to build compact and run-time efficient models. A cluster is classified as datapath if both the support vector machine and the neural network indicate that it is datapath-like. The cluster features may include automorphism generators for the cell clusters, or physical information based on the cell locations from a previous (e.g., global) placement, such as a ratio of a total cell area for a given cluster to a half-perimeter of a bounding box for the given cluster.

12 Claims, 6 Drawing Sheets

MACHINE-LEARNING BASED DATAPATH EXTRACTION

BACKGROUND OF THE INVENTION

1. Field of the Invention

The present invention generally relates to the design of semiconductor chips and integrated circuits, and more particularly to a method of identifying different portions of an integrated circuit design which may be handled differently during optimized placement of the circuit components in a layout.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction. Given a netlist $N=(V, E)$ with nodes (vertices) V and nets (edges) E, a global placement tool obtains locations $(x_i, y_i)$ for all the movable nodes, such that the area of nodes within any rectangular region does not exceed the area of cell sites in that region. Though some work has looked at general Steiner wirelength optimization, placers typically minimize the half-perimeter wirelength (HPWL) of the design. Modern placers often approximate HPWL by a differentiable function using a quadratic objective.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources.

As technology scales beyond the deep-submicron regime and operating frequencies increase, a new style is emerging in the design of integrated circuits referred to as hybrid designs, which contain a mixture of random logic and datapath (standard cell) components. FIG. 1A illustrates an example of a random logic layout 1 having three rows containing various cells. A given logic function or cone may have cells randomly distributed in different rows to satisfy the placement constraints, with no particular boundaries for any set of cells. FIG. 1B depicts a contrasting example of datapath logic layout 2 with five subcircuits or macros each having predefined geometries. Datapath logic was traditionally placed manually, i.e., a custom design, but there has been a significant effort in recent years to include the placement of datapath logic in the automation process, particularly for hybrid designs which also contain random logic. However, placement formulation for datapath logic is generally different than that for random logic. Random logic placers ignore this aspect of hybrid designs, which can lead to major wirelength and congestion issues with state-of-the-art devices.

Methods have accordingly been devised for automatically extracting datapaths from a netlist. Datapath extraction techniques generally focus on functional or structural levels in the design. Functional regularity extraction identifies logically equivalent subcircuits within a netlist that are then handled separately during placement. In one example a large set of templates are generated and used to search for datapath logic before placement. Another functional regularity example uses a hash-based approach. Methods of structural datapath extraction rely on a regularity metric to represent the datapath. For example, datapath extraction can consist of a decomposition of the netlist into a set of stages and a set of slices with one cell occurring in exactly one stage set and one slice set. This extraction algorithm expands in search-waves through the network using the regularity metric to determine the expansion direction. More recently, a method for extracting structure has been developed with the assumption that the placement distance between a pair of cells is related to the graph distance between them. Nets are weighted in a shortest path computation by assuming the distance between two cells is related to the degree of the net connecting them. Then, by extracting "corner" cells and fixing them in place, the maximum distance of the other cells can be calculated.

SUMMARY OF THE INVENTION

The present invention is directed to a method of extracting datapath logic from an integrated circuit design, by receiving a circuit description for the integrated circuit design which includes a plurality of cells interconnected to form a plurality of nets, generating cell clusters from the circuit description, evaluating the cell clusters to identify cluster features, and selectively classifying the cell clusters as either datapath logic or non-datapath logic using one or more machine-learning models based on the cluster features. Two machine-learning models can be used, each providing an indication of whether a given one of the cell clusters is datapath logic, and the given cell cluster can be classified as datapath only if both of the machine-learning models indicate that the given cell cluster is datapath logic. In the illustrative implementation a first one of the machine-learning models is a support vector machine, and a second one of the machine-learning models is a neural network. The cluster features may include automorphism generators for the cell clusters, or physical information based on the cell locations from a previous placement. The physical information may include a ratio of a total cell area for a given cluster to a half-perimeter of a bounding box for the given cluster.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Previous datapath extraction algorithms which use only functional or structural information are not effective for modern large-scale, hybrid (datapath/random logic) circuits having many pre-placed blocks, for many reasons. Traditional synthesis optimization objectives (both the synthesis and physical design stages) are often at odds with what a custom circuit designer would implement. One simple example is how area optimization during synthesis often disrupts the regular structure of a datapath. Design tools are not created to extract logical hierarchy naturally. They generally flatten the design which in the case of random logic is beneficial, but this approach again disrupts the ability to identify quality placement and timing solutions. Each stage in the synthesis flow is generally independent of other optimization stages requiring significant amounts of iterations. For example, synthesis optimization (optimizing the Boolean logic before technology mapping) is generally not timing aware. Placement is generally not aware of routability. Current attempts to mitigate these issues focus simply on iterative techniques to gradually improve wirelength without hurting placement, and none of them actually solve for how or why datapath logic is different.

It would, therefore, be desirable to devise an improved method of datapath extraction which could automatically classify areas of a circuit design as either datapath or random logic so as to allow placement tools to separately handle those two types of circuitry. It would be further advantageous if the method could efficiently manage large design sizes without requiring excessive run time. The present invention achieves these objectives using a high-dimensional data learning, extraction, and evaluation algorithm. This inventive approach can consider not only logic structures, but also placement hints from initial global placement results. The novel extraction method has demonstrated significantly better results than previous state-of-the-art methods on both hybrid industrial designs which contain random logics and data paths, and placement benchmarks where structured datapath logics were not even intended. Both graph-based and physical features can be analyzed and extracted from the netlist, mapping a set of parameters most critical and sensitive to datapath logic. Effective features can be used to create differentiation between random and datapath logic, allowing the patterns extracted from a training set to classify datapath structures in new circuits.

Figure 1A:
FIG. 1A is an example of a conventional random logic layout.
Figure 1A:
Figure 1A:
Figure 1B:
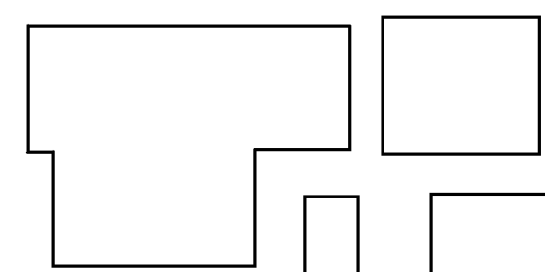
FIG. 1B is an example of a conventional datapath logic layout.
Figure 1B:
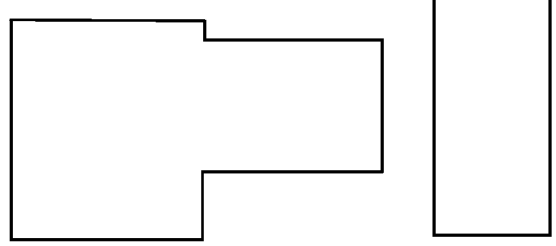
Figure 2:
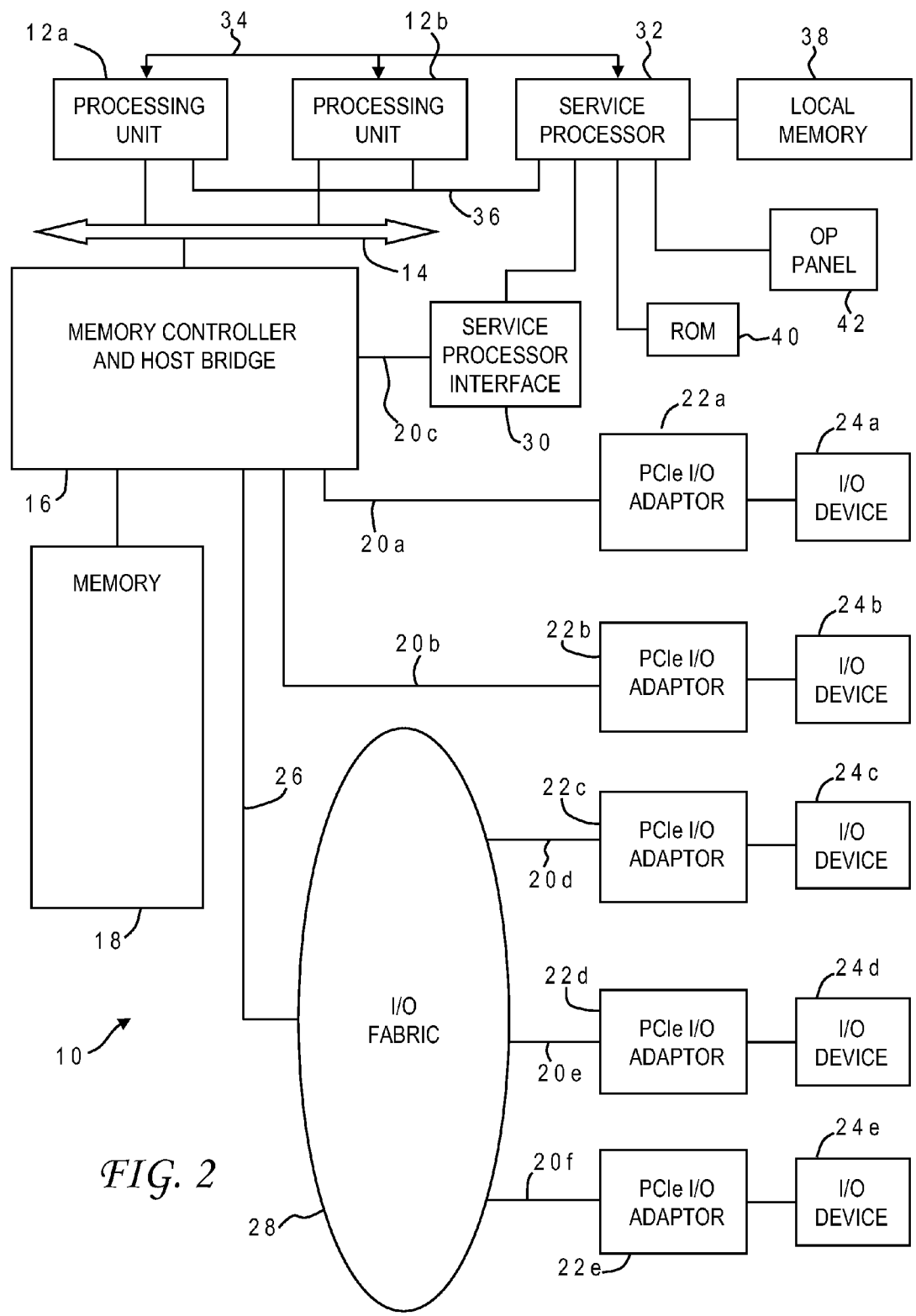
FIG. 2 is a block diagram of a computer system programmed to carry out integrated circuit design in accordance with one implementation of the present invention.

With reference now to the figures, and in particular with reference to FIG. 2, there is depicted one embodiment 10 of a computer system in which the present invention may be implemented to carry out the design of logic structures in an integrated circuit. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for a physical synthesis process that uses novel datapath extraction techniques to optimize cell placement. Accordingly, a program embodying the invention may include conventional aspects of various synthesis or placement tools, and these details will become apparent to those skilled in the art upon reference to this disclosure. In the illustrative implementation, computer system 10 carries out datapath extraction by generating candidate clusters of the original netlist in which to search for datapath structures, and evaluating each cluster to identify specific characteristics used to distinguish datapath logic from random logic. Machine learning techniques can then be used to classify the clusters based on training models.

Figure 3:
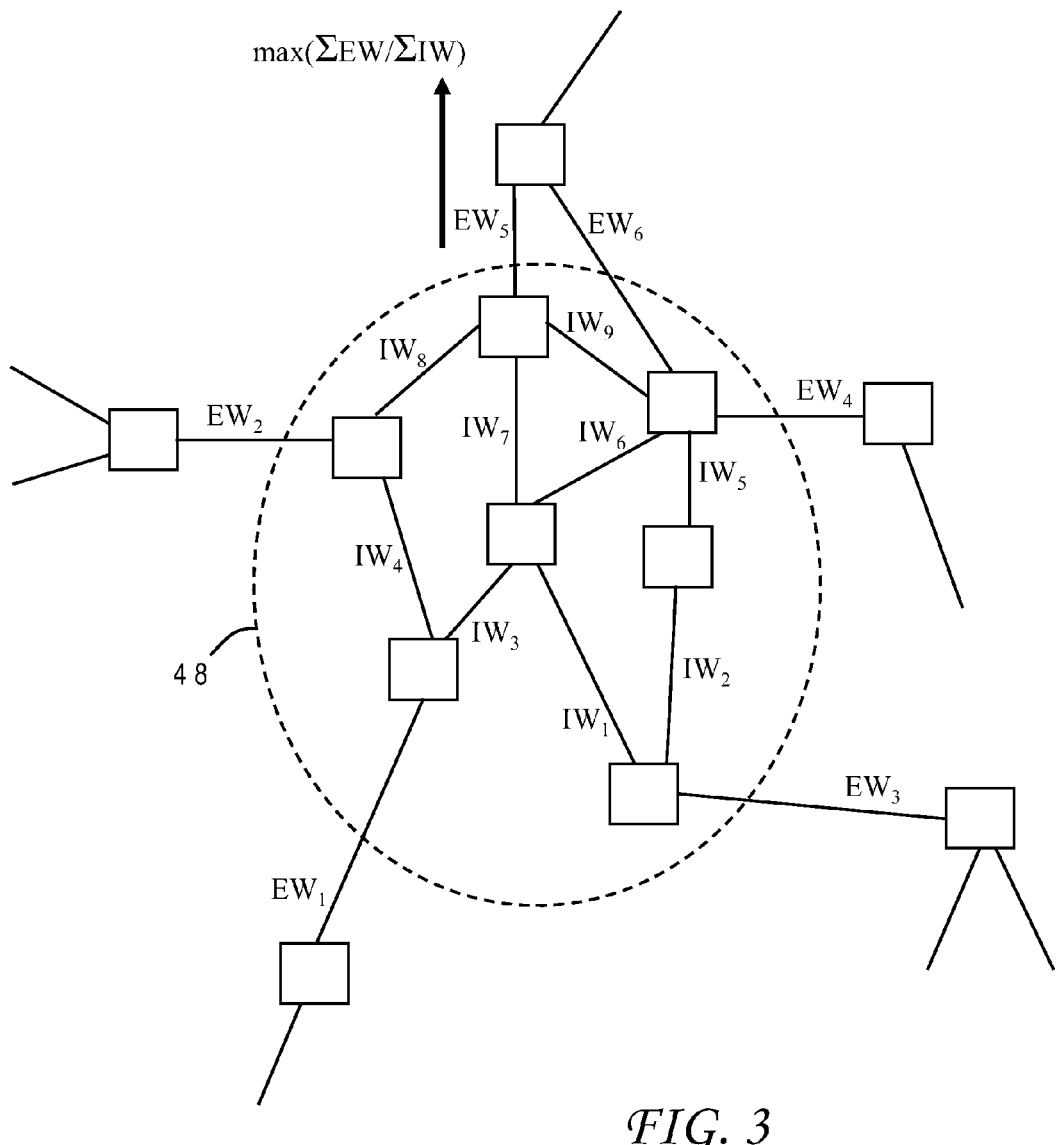
FIG. 3 is a pictorial representation of a seed growth method for identifying candidate clusters in a netlist.

The clustering stage prepares the netlist to analyze and extract datapath structures from. The goal is to find clusters exhibiting identifiable structural and physical features. There are numerous conventional techniques for grouping cells of an integrated circuit design into clusters. The preferred implementation of the present invention uses an extension of the connectivity-based seed growth method proposed by Liu and Marek-Sadowska in the paper "Pre-Layout Physical Connectivity Predictions With Applications In Clustering, Placement And Logic Synthesis," Proc. ICCAD, pages 31-37 (2005). According to that technique, a ratio of external to internal cluster forces is maximized while maintaining a maximum logic depth threshold. The external force is defined as the summation of the edge weights of nets with at least one vertex (node) outside and one inside a given cluster $C_i$ and the internal force is defined as the summation of all internal cluster connection weights, as depicted FIG. 3. A candidate cluster 48 has seven internal nodes with connections to five external nodes. The internal connection weights are $IW_1$-$IW_9$, and the external connection weights are $EW_1$-$EW_6$. Specific weight values can be determined according to the particular net model used. The internal and external forces affect the physical size of a cluster in opposite directions. The internal force tries to keep the nodes together in the final layout, whereas the external force tends to pull the nodes apart.

This clustering method uses a bottom-up algorithm which starts from a seed node. Suitable seed nodes are those with large net degrees, i.e., the nodes are sorted by node degree, and a seed node is selected which is currently unclustered and has the largest node degree. The connectivity between a neighboring node u of a cluster $C_i$ is equal to the sum of edge weights for all connections between u and nodes within the cluster. In each subsequent pass, the neighboring node with the largest connectivity is added to the cluster while keeping the internal force of the cluster as large as possible. Neighboring nodes are added in each pass until the size of the cluster exceeds a cluster size constraint.

Figure 4A:
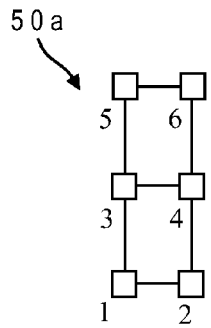
FIG. 4A is an example of a cell cluster which may be evaluated for automorphisms in accordance with one implementation of the present invention.
Figure 4B:
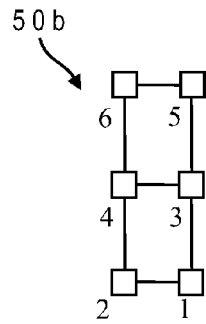
FIG. 4B is a first automorphism of the cell cluster of FIG. 4A.
Figure 4C:
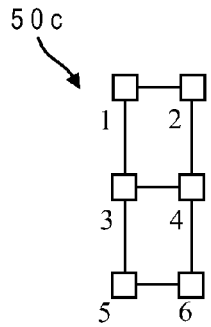
FIG. 4C is a second automorphism of the cell cluster of FIG. 4A.
Figure 4D:
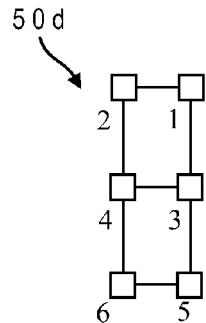
FIG. 4D is a third automorphism of the cell cluster of FIG. 4A.

Once clusters in the netlist have been identified, computer system 10 extracts and evaluates distinguishing features of the clusters. The present invention can take advantage of the observation that most datapath logic contains a high degree of graph automorphism. An automorphism of a graph (a form of symmetry) preserves the edge-vertex connectivity of a graph G=(V; E) while mapping onto itself. That is, an automorphism is a graph isomorphism from G to itself, i.e., a permutation of the vertex set V such that the pair of vertices (u; v) form an edge if and only if the pair ((u); (v)) also form an edge. The set of automorphisms of a given graph forms the automorphism group for that graph. Generators for the automorphism group are defined as a set of elements which may be combined to generate every non-identical permutation in the automorphism group. For example, FIG. 4A depicts a graph G having six labeled nodes and seven edges. This graph has a total of four automorphisms and two generators. The first automorphism, G(1; 2; 3; 4; 5; 6), corresponds to itself, with three additional automorphisms: G(2; 1; 4; 3; 6; 5) as seen in FIG. 4B (G flipped left-right); G(5; 6; 3; 4; 1; 2) as seen in FIG. 4C (G flipped upside-down); and G(6; 5; 4; 3; 2; 1) as seen in FIG. 4D (G flipped left-right and upside-down). The nontrivial generator set S of G is (1; 5)(2; 6) and (1; 2)(3; 4)(5; 6). As this example shows, the symmetry of the graph along with the generator group provides possible bit-stack candidates including: (1; 2), (5; 6) or (1; 3; 5), (2; 4; 6), an indication that the graph should be judged as datapath logic.

Figure 5:
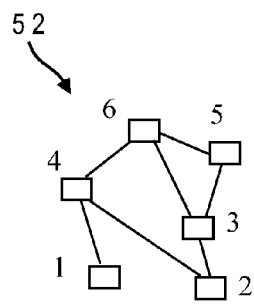
FIG. 5 is an example of a cell cluster which is determined to have no automorphisms in accordance with one implementation of the present invention.

In contrast, FIG. 5 displays a random logic netlist 52 also having six nodes and seven edges. However, unlike the clear symmetry present in FIG. 4A, the graph of FIG. 5 contains no nontrivial automorphisms. This fundamental observation holds true for random logic netlists in general. Thus, the automorphism generators of structured logic appear very differently than the automorphism generators of random logic enabling sufficient differentiation as a datapath feature.

Figure 6:
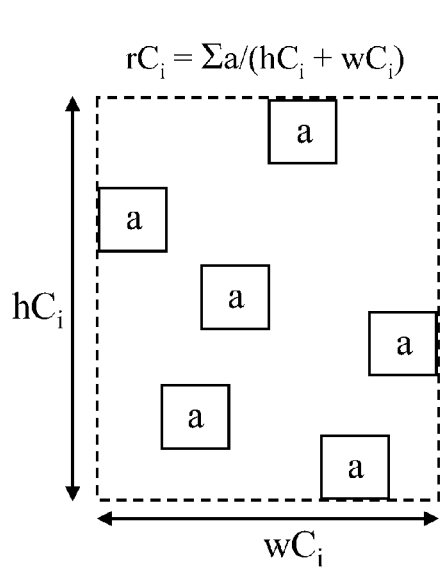
FIG. 6 is a layout for a cell cluster depicting how placement hints may be derived including a ratio of total cell area to a sum of cluster width and height in accordance with one implementation of the present invention.

While graph automorphism features are particularly useful in classifying logic as random or datapath, the present invention may alternatively or additionally take advantage of physical information gleaned from a previous placement optimization, e.g., global placement. Global placement has merit in wirelength optimization, so the present invention can use placement hints for improved classification. In one implementation, the physical information so used relates to the area of the cells within a cluster and the size of the cluster's bounding box, as shown in FIG. 6. In particular, this feature can be quantified as the ratio $rC_i$ of the total cell area within cluster $C_i$ to the sum of the bounding box height and width. This physical information helps to characterize the amount of spreading and the initial cell locations for each cluster. Dense clusters indicate tightly packed logic and possibly the need for improved placement whereas sparse logic is generally less likely to improve from being passed to a datapath placer. The previous placement may be from some other placement tool, and could be an initial placement or even an incomplete placement.

Figure 7:
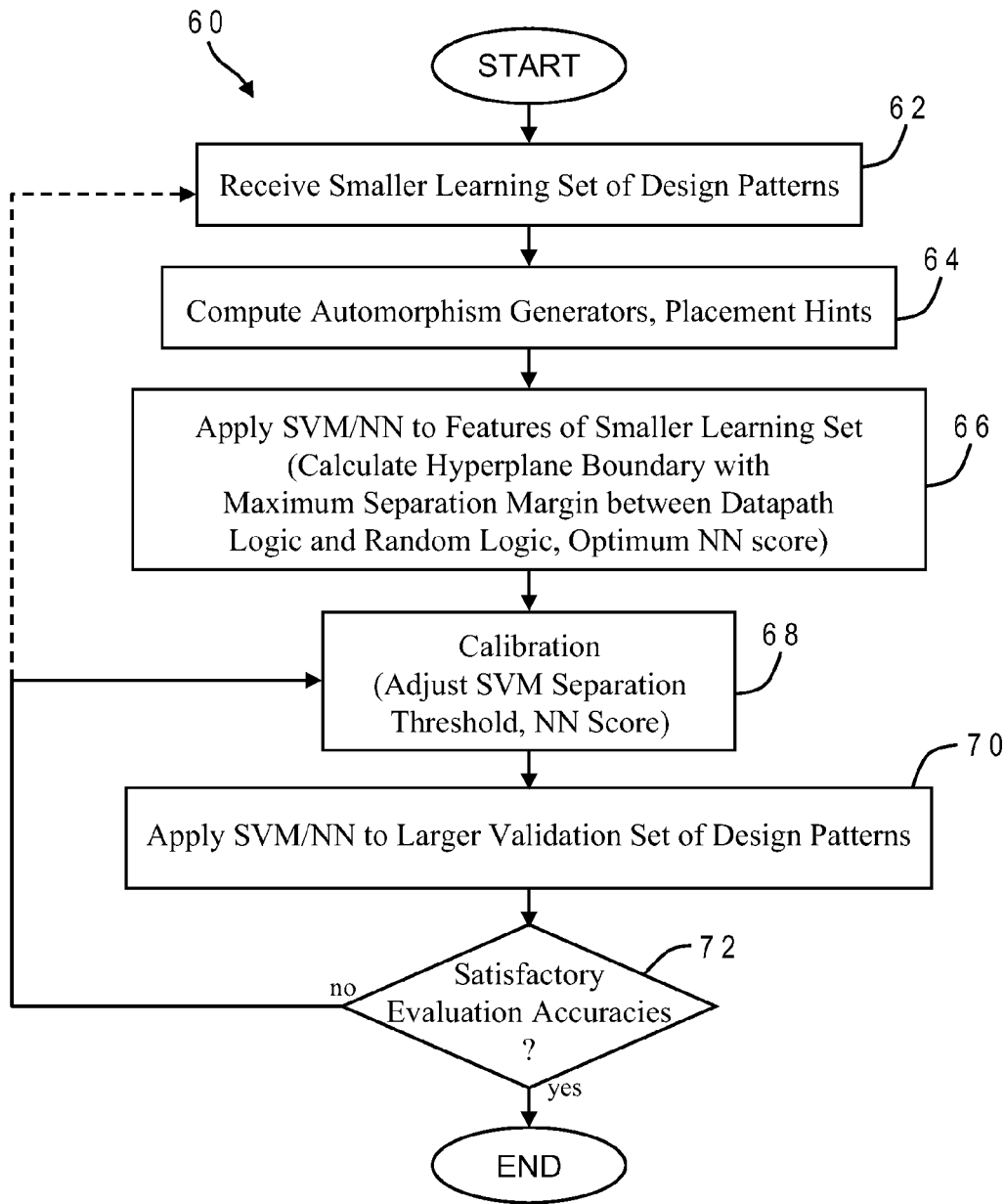
FIG. 7 is a chart illustrating the logical flow for a training process used in accordance with one implementation of the present invention to generate machine learning models for classifying a cluster as datapath or non-datapath (random)

Computer system 10 uses the cluster features to classify and evaluate each cluster with machine-learning based models. In the preferred implementation computer system 10 combines two data learning algorithms, a support vector machine (SVM) and a neural network (NN), to build compact and run-time efficient models, although other machine-learning models may be used. FIG. 7 illustrates a training process 60 for creating the models. The process begins with a learning set of design patterns (cell cluster netlists) which are known or designated to be either datapath or random in nature, with cells located in a manner similar to a global or other optimized placement (62). The learning set is preferably relatively small (for example, as small as a few thousand patterns), and since the patterns are built a priori at a one time cost, the CPU run-time penalty is negligible. For each learning pattern, any automorphism generators and physical information associated with the placement are computed (64). Corresponding support vectors are created and the SVM calculates a hyperplane boundary with maximum separation margin between datapath and non-datapath logic associated with the support vectors (66). Only the critical information on the separation boundaries is preserved in the SVM model, i.e., the corresponding support vectors. All of the support vectors are involved in the SVM decision calculation (score). The NN operates by configuring complex networks of neurons to achieve a high dimensional decision diagram-like data structure associated with the same training samples (automorphism generators and physical information) and decision hints. In the illustrative embodiment the NN generates a score which is normalized between −1 (indicating random logic) and +1 (indicating datapath logic). The decision can be biased to maximize the number of correctly selected datapath circuits by moving the required score closer to the datapath logic maximum; for example, logic may be indicated as datapath only if its normalized score is above 0.8. A resilient backward propagation method based on iterative sub-gradient updates can be employed. For better quality, both a soft-error tolerant SVM and a special working set selection method can be used.

After the boundaries are calculated the models can be calibrated, preferably by manual adjustment of the separation threshold and/or NN score (68). The designer can move the boundaries to account for noise in the test data or otherwise improve the evaluation accuracies. The model is then applied to a larger set of known design patterns (exclusive from the learning set) for validation, to assure a balance of learning accuracies between the training data and the unknown testing data (70). The validation set is preferably large compared to the learning set (for example 30,000 patterns). In the illustrative implementation two types of accuracies are defined to quantify the learning performance, datapath evaluation accuracy and non-datapath evaluation accuracy. Datapath evaluation accuracy is the rate of correctly detected datapath (or datapath-like) patterns over the total number of actual datapath structures. Non-datapath evaluation accuracy is the rate of correctly detected non-datapath (e.g., random logic) patterns over the total number of non-datapath structures processed. The optimization objective for both SVM and NN is to maximize the evaluation accuracies of datapath and non-datapath patterns, or equivalently, to minimize the mean square errors for both classes of pattern evaluation.

The evaluation accuracies can be compared to minimum rates in order to determine whether the model is valid, i.e., whether there is sufficient confidence (72). The minimum rates may vary depending on the set of learning patterns used. If the model is considered valid, the training is complete. Otherwise, the model may be recalibrated (returning to box 68), or the designer may decide to apply additional learning sets (returning to box 62). Once validated, the model is ready for use in datapath extraction on new (unknown) circuit designs.

Figure 8:
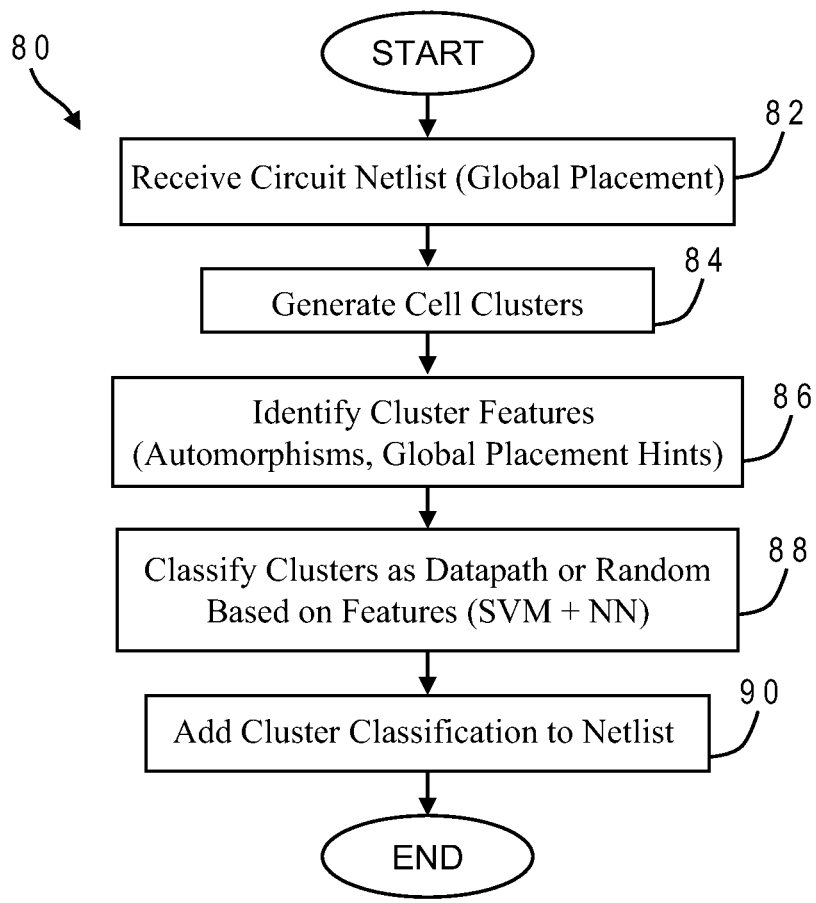
FIG. 8 is a chart illustrating the logical flow for a datapath extraction process in accordance with one implementation of the present invention.

The present invention may be further understood with reference to the chart of FIG. 8 which shows the logical flow for one implementation of a datapath extraction process 80. The process begins by receiving the netlist for a new circuit design or portion thereof (82). The design has preferably undergone an optimized placement such as global placement, and the placement information is included in the netlist so that physical information can be considered in the analysis, but those skilled in the art will appreciate that datapath extraction according to the present invention may still proceed without such physical information. Cells or nodes of the design are grouped into clusters according to any convenient clustering algorithm, such as the connectivity-based seed growth method described above (84). Cluster features are identified, including automorphisms and their generators, and physical information from global placement hints, such as the ratio of total cell area to bounding box half-perimeter (86). Each of the clusters is then individually classified as either datapath logic or random logic by applying the data learning models to evaluate the cluster features (88). As the new patterns go through the learning models, their evaluation scores could span within certain ranges for datapath and non-datapath patterns, respectively, for both NN and SVM, so the designer may choose different bases for deciding whether a given cluster is datapath. In the preferred implementation, a pattern is determined to datapath logic if and only if both of the NN and SVM evaluation scores indicate datapath logic (i.e., are above certain thresholds). This redundant approach helps to systematically improve the datapath evaluation accuracy without noticeable penalty in non-datapath accuracy. Usually NN and SVM have similar performance for most binary classifications, e.g., differentiating datapath-like and non-datapath patterns. In principle, SVM guarantees the global optimum but can be sensitive to data noise. NN usually has good noise robustness, however it can take more time in training and calibration to reach an optimal or close-to-optimal result.

Once all of the clusters have been evaluated, the netlist is updated with the classification information (90), and the process ends. The classification information can be used in later design stages by a placement tool which employs different methodologies for datapath versus random logic. For example, datapath logic may be placed according to the tiered assignment method described in U.S. patent application Ser. No. 13/451,382 filed Apr. 19, 2012, for improved bit-stack alignment. Experimental results indicate significant wirelength improvements during automated placement using the novel extraction methods described herein. Datapath wirelength improvements were even greater.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A computer-implemented method of extracting datapath logic from an integrated circuit design, comprising:
   receiving a circuit description for the integrated circuit design which includes a plurality of cells interconnected to form a plurality of nets, by executing first instructions in a computer system;
   generating cell clusters from the circuit description, by executing second instructions in the computer system;
   evaluating the cell clusters to identify one or more cluster features in the cell clusters, by executing third instructions in the computer system; and
   selectively classifying the cell clusters as either datapath logic or non-datapath logic using one or more machine-learning models based on the one or more cluster features, by executing fourth instructions in the computer system wherein said classifying uses at least two machine-learning models each providing an indication of whether a given one of the cell clusters is datapath logic, and the given cell cluster is classified as datapath only when both of the two machine-learning models indicate that the given cell cluster is datapath logic wherein a first one of the machine-learning models is a support vector machine, and a second one of the machine-learning models is a neural network.

2. The method of claim 1 wherein the cluster features include automorphism generators for the cell clusters.

3. The method of claim 1 wherein the circuit description further includes locations for the cells from a previous placement, and the cluster features include physical information based on the cell locations.

4. The method of claim 3 wherein the physical information includes a ratio of a total cell area for a given cluster to a half-perimeter of a bounding box for the given cluster.

5. A computer system comprising:
   one or more processors which process program instructions;
   a memory device connected to said one or more processors; and
   program instructions residing in said memory device for extracting datapath logic from an integrated circuit design by receiving a circuit description for the integrated circuit design which includes a plurality of cells interconnected to form a plurality of nets, generating cell clusters from the circuit description, evaluating the cell clusters to identify one or more cluster features in the cell clusters, and selectively classifying the cell clusters as either datapath logic or non-datapath logic using one or more machine-learning models based on the one or more cluster features wherein said program instructions classify the cell clusters using at least two machine-learning models each providing an indication of whether a given one of the cell clusters is datapath logic, and the given cell cluster is classified as datapath only when both of the two machine-learning models indicate that the given cell cluster is datapath logic wherein a first one of the machine-learning models is a support vector machine, and a second one of the machine-learning models is a neural network.

6. The computer system of claim 5 wherein the cluster features include automorphism generators for the cell clusters.

7. The computer system of claim 5 wherein the circuit description further includes locations for the cells from a previous placement, and the cluster features include physical information based on the cell locations.

8. The computer system of claim 7 wherein the physical information includes a ratio of a total cell area for a given cluster to a half-perimeter of a bounding box for the given cluster.

9. A computer program product comprising:
   a computer-readable storage medium; and
   program instructions residing in said storage medium for extracting datapath logic from an integrated circuit design by receiving a circuit description for the integrated circuit design which includes a plurality of cells interconnected to form a plurality of nets, generating cell clusters from the circuit description, evaluating the cell clusters to identify one or more cluster features in the cell clusters, and selectively classifying the cell clusters as either datapath logic or non-datapath logic using one or more machine-learning models based on the one or more cluster features wherein said program instructions classify the cell clusters using at least two machine-learning models each providing an indication of whether a given one of the cell clusters is datapath logic, and the given cell cluster is classified as datapath only when both of the two machine-learning models indicate that the given cell cluster is datapath logic wherein a first one of the machine-learning models is a support vector machine, and a second one of the machine-learning models is a neural network.

10. The computer program product of claim 9 wherein the cluster features include automorphism generators for the cell clusters.

11. The computer program product of claim 9 wherein the circuit description further includes locations for the cells from a previous placement, and the cluster features include physical information based on the cell locations.

12. The computer program product of claim 11 wherein the physical information includes a ratio of a total cell area for a given cluster to a half-perimeter of a bounding box for the given cluster.

* * * * *